(12) United States Patent
Zhang et al.

(10) Patent No.: US 7,879,666 B2
(45) Date of Patent: Feb. 1, 2011

(54) SEMICONDUCTOR RESISTOR FORMED IN METAL GATE STACK

(75) Inventors: Da Zhang, Hopewell Junction, NY (US);
Chendong Zhu, Beacon, NY (US);
Xiangdong Chen, Poughquag, NY (US);
Melanie Sherony, Fishkill, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 182 days.

(21) Appl. No.: 12/177,986

(22) Filed: Jul. 23, 2008

(65) Prior Publication Data
US 2010/0019328 A1    Jan. 28, 2010

(51) Int. Cl.
*H01L 21/336*    (2006.01)
*H01L 21/8234*    (2006.01)

(52) U.S. Cl. .................... 438/197; 438/199; 438/510; 438/680; 257/E21.17; 257/E21.051; 257/E21.085; 257/E21.115; 257/E21.127; 257/E21.247; 257/E21.248; 257/E21.429; 257/E21.435; 257/E21.632

(58) Field of Classification Search ............... 438/197, 438/199, 311, 141, 237, 501, 505, 508, 510, 438/602, 603, 604, 679, 680, 752, 753; 257/E21.17, 257/E21.051, E21.085, E21.115, E21.127, 257/E21.247, E21.248, E21.424, E21.435, 257/E21.632
See application file for complete search history.

(56) References Cited

U.S. PATENT DOCUMENTS

| | | | | |
|---|---|---|---|---|
| 5,885,862 A | * | 3/1999 | Jao et al. | 438/238 |
| 6,054,359 A | | 4/2000 | Tsui et al. | |
| 6,171,910 B1 | * | 1/2001 | Hobbs et al. | 438/275 |
| 6,261,935 B1 | * | 7/2001 | See et al. | 438/592 |
| 6,300,201 B1 | * | 10/2001 | Shao et al. | 438/281 |
| 6,406,956 B1 | | 6/2002 | Tsai et al. | |

* cited by examiner

*Primary Examiner*—David Nhu
(74) *Attorney, Agent, or Firm*—Hamilton & Terrile, LLP; Michael Rocco Cannatti

(57) ABSTRACT

A semiconductor process and apparatus fabricate a metal gate electrode (30) and an integrated semiconductor resistor (32) by forming a metal-based layer (26) and semiconductor layer (28) over a gate dielectric layer (24) and then selectively implanting the resistor semiconductor layer (28) in a resistor area (97) to create a conductive upper region (46) and a conduction barrier (47), thereby confining current flow in the resistor semiconductor layer (36) to only the top region (46) in the finally formed device.

20 Claims, 4 Drawing Sheets

US 7,879,666 B2

SEMICONDUCTOR RESISTOR FORMED IN METAL GATE STACK

BACKGROUND OF THE INVENTION

1. Field of the Invention

The present invention is directed in general to the field of semiconductor devices. In one aspect, the present invention relates to the fabrication of metal gate electrodes and semiconductor resistors for CMOS devices.

2. Description of the Related Art

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional MOS transistor exacerbates problems of polysilicon gate depletion, high gate resistance, high gate tunneling leakage current and dopant (i.e., boron) penetration into the channel region of the device. As a result, CMOS technology is increasingly replacing silicon dioxide gate dielectrics and polysilicon gate conductors with high dielectric constant (high-k) dielectrics in combination with metal gate electrodes formed from a gate stack of polysilicon and one or more metal layers. With such technologies, the metal gate layers not only obviate gate-depletion and boron-penetration effects, but also provide a significantly lower sheet resistance. However, due to the relatively high conductivity of the metal gate layers, the metal gate layers must typically be removed from the area where polysilicon resistors are formed since the higher conductivity of the metal gate layer detrimentally lowers the resistance of the polysilicon resistors, thereby requiring additional processing steps to selectively remove the metal layer in the resistor area by patterning a hard mask layer to expose the metal layer and then etching the exposed metal layer so that the subsequently deposited polysilicon layer is not formed over the metal gate layer in the resist area. In addition to adding complexity and cost to the fabrication process, the resulting structure has different stack heights in the transistor and resistor areas which can adversely impact subsequent processing. To provide an illustrative example, reference is made to FIG. 1 which shows a cross section of a semiconductor structure 1 in which a transistor gate electrode 17 and semiconductor resistor 18 are formed on a silicon substrate 10. As illustrated, isolation regions 12, 13 are formed in the surface of substrate 10, such as by forming field oxide or shallow trench isolation regions. The isolation regions 12, 13 define and electrically isolate active surface regions in the surface of substrate 10 where the transistor(s) will ultimately be formed. In addition, the isolation region 13 defines the surface on which the semiconductor resistor 18 is formed. After the isolation regions 12, 13 are formed, a gate dielectric layer 14 is formed over the semiconductor structure, followed by the deposition of a metal layer 15 over the gate dielectric layer. However, prior to forming the semiconductor layer 16, the metal gate layer must be removed from the resistor area, such as by applying and patterning a hard mask to expose the metal layer 16 over the isolation region 13, and then etching the exposed metal layer 16 from the resistor area. Having removed the metal layer from the resistor area, the subsequently deposited semiconductor layer 16 is formed on the metal gate layer 15 in the transistor area, but is formed on the gate dielectric layer 14 in the resistor area. With this stack in place, the subsequent pattern and etch processes result in a height differential between the transistor gate electrode 17 and semiconductor resistor 18.

Accordingly, a need exists for an improved poly/metal gate electrode and manufacture method for manufacturing MOSFET devices in which integrated semiconductor resistors are formed. In addition, there is a need for improved semiconductor device structure and manufacturing process to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
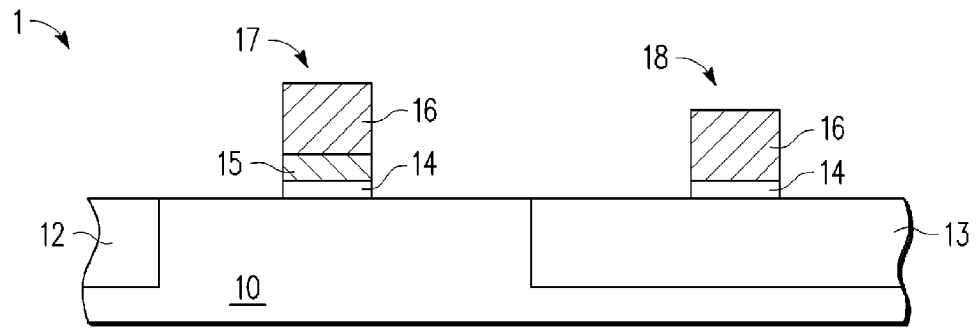
FIG. 1 is a partial cross-sectional view of a conventionally formed metal/semiconductor gate structure and a semiconductor resistor formed on semiconductor structure.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

An integrated semiconductor resistor is formed using a metal gate electrode stack which is formed by sequentially depositing a metal layer and semiconductor layer over a high-k gate dielectric layer and then forming a conduction barrier in the lower portion of the semiconductor layer in the resistor area by doping or implanting the upper portion of the resistor semiconductor layer. By controlling the doping of the resistor semiconductor layer, a doping profile may be achieved that has a relatively heavier doping concentration near an upper surface region, and a relatively light doping concentration below the upper surface region which limits current flow in the lower part of the resistor semiconductor layer, thereby creating a strong conduction barrier in the lower part of the resistor semiconductor layer in contact with the gate metal layer. In selected embodiments, the conduction barrier may be created by implanting the upper portion of the resistor semiconductor layer with either an n-type or p-type dopant, such as by using a relatively light implant (e.g., extension or LDD) to simultaneously implant the upper portion of the resistor semiconductor layer, or using a relatively heavy implant (e.g., source/drain implant) in combination with an implantation barrier to simultaneously implant the upper portion of the resistor semiconductor layer. Alternatively, a separate implantation may be used to implant the upper portion of the resistor semiconductor layer after masking off the transistor area. In other embodiments, a lower region in the resistor semiconductor layer is implanted with a first dopant type (e.g., n-type) and an upper region in the resistor semiconductor layer is implanted with a second, different dopant type (e.g., p-type), thereby creating a p/n diode junction to confine current flow to only the top region.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

Figure 2:
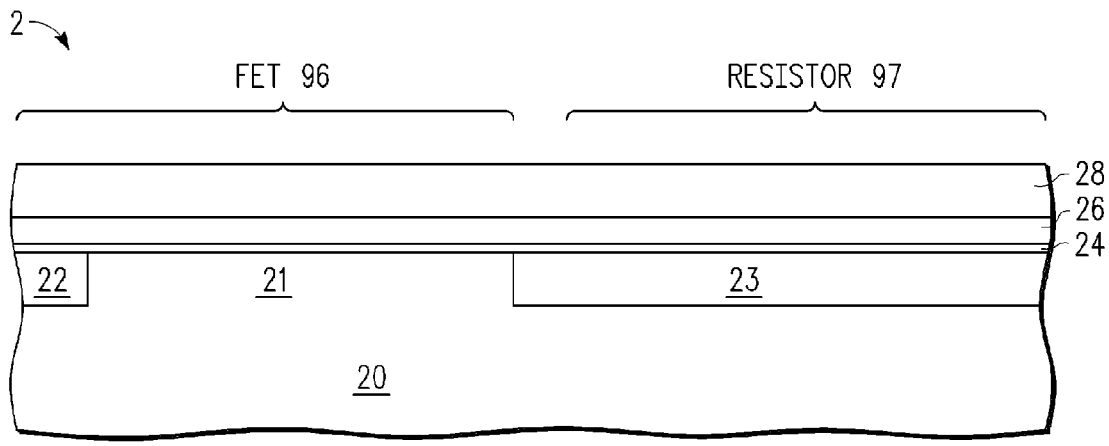
FIG. 2 is a partial cross-sectional view of a semiconductor structure including a substrate, a gate dielectric layer, a metal layer and a semiconductor layer formed over a transistor area and a resistor area.

Turning now to FIG. 2, a partial cross-sectional view is depicted of a semiconductor structure 2 which includes a substrate 20, a gate dielectric layer 24, and an unetched gate stack including at least a first metal layer 26, and a silicon-containing semiconductor layer 28 formed over a transistor area 96 and a resistor area 97. The structure 2 includes a semiconductor layer 21 formed on or as part of a semiconductor substrate 20 that is delineated by shallow trench isolations 22, 23. Depending on the type of transistor device being fabricated, the semiconductor layer 20, 21 may be formed from any semiconductor material, including, for example, Si, SiC, SiGe, SiGeC, Ge, GaAs, InAs, InP as well as other III/V or II/VI compound semiconductors or any combination thereof. Of note is that although bulk type of substrate is shown here for the description of the invention, the invention is not limited to any specific substrate type. For example, the starting substrate for the invention can be of semiconductor-on-insulator (SOI) type having a buried insulator layer under a top layer of semiconductor. Though not illustrated, one or more isolation regions and/or well regions may be formed in the substrate 20 to define one or more active regions over which the transistor devices are formed, such as by using a twin well process in which first well is selectively implanted into portions of substrate 20 where devices of a first conductivity type will be formed while a second well is selectively implanted into regions of substrate 20 into which transistors of a second different and opposite conductivity type will be formed.

The isolation regions or structures 22, 23 are formed to electrically isolate the active area(s) 21 for the NMOS or PMOS devices. Isolation structures 22, 23 define lateral boundaries of an active region 21 or transistor region 96, and may be formed using any desired technique, such as selectively etching an opening in the substrate 20 using a patterned mask or photoresist layer (not shown), depositing a dielectric layer (e.g., oxide) to fill the opening, and then polishing the deposited dielectric layer until planarized with the remainder of the substrate 20. Any remaining unetched portions of the patterned mask or photoresist layer(s) are stripped.

Prior to forming the metal layer 26, an insulator or dielectric layer 24 is formed by depositing or growing an insulator or dielectric (e.g., silicon dioxide, oxynitride, metal-oxide, nitride, etc.) over the semiconductor substrate 20 using chemical vapor deposition (CVD), plasma-enhanced chemical vapor deposition (PECVD), physical vapor deposition (PVD), atomic layer deposition (ALD), thermal oxidation, or any combination(s) of the above. In an illustrative implementation, first dielectric layer 24 comprises a metal-oxide compound formed by chemical vapor deposition, physical vapor deposition, or by atomic layer deposition having a typical final thickness is in the range of 0.1-10 nanometers, though other thicknesses may be used. A suitable metal oxide compound for use as first dielectric layer 12 is hafnium oxide (preferably $HfO_2$), though other oxides, silicates or aluminates of zirconium, aluminum, lanthanum, strontium, tantalum, titanium and combinations thereof may also be used, including but not limited to $Ta_2O_5$, $ZrO_2$, $HfO_2$, $TiO_2$, $Al_2O_3$, $Y_2O_3$, $La_2O_3$, $HfSiO_x$, $ZrSiO_x$, $ZrHfOx$, $LaSiO_x$, $YSiO_x$, $ScSiO_x$, $CeSiO_x$, $HfLaSiO_x$, $HfAlO_x$, $ZrAlO_x$, and $LaAlO_x$. In addition, multi-metallic oxides (for example barium strontium titanate, BST) may also provide high-k dielectric properties.

After forming the first dielectric layer 24, an unetched gate stack is formed using any desired metal gate stack formation sequence. For example, one or more conductive layers are sequentially deposited or formed over the first dielectric layer 24 to form a first gate stack that includes at least a (doped or undoped) semiconductor layer 28 formed over a metal gate layer 26. In one embodiment, the one or more metal or metal-based layers 26 are formed using any desired deposition or sputtering process, such as CVD, PECVD, PVD, ALD, molecular beam deposition (MBD) or any combination(s) thereof The first metal-based layer 26 includes an element selected from the group consisting of Ti, Ta, Ir, Mo, Ru, W, Os, Nb, Ti, V, Ni, and Re. In selected embodiments, the first metal-based layer 26 may be formed with a metal or metal-based layer that has a work function that is suitable for an NMOS transistor, such as be depositing a TaC layer having a thickness of less than 20-100 Angstroms, though other metallic gate layer materials (such as HfC, TiN, TaSi, ZrC, Hf, etc.) or even a conductive metal oxide (such as $IrO_2$), and different thicknesses, may be used. An example process for depositing a thin TaC layer 26 uses a physical vapor deposition (PVD) process to reactively sputter TaC from a Ta target in an Ar, $C_xH_y$ ambient, though an ALD process could be used to selectively form a thin TaC layer 26 on the surface of the semiconductor structure 20 by applying a $TaF_5$ pulse (or some other tantalum-containing precursor, such as tantalum halide or tantalum metal organic), then purging with argon, then pulsing with plasma (e.g., $C_xH_y$) and then purging with argon again. This sequence of steps may be repeated until the desired thickness of TaC is obtained on the semiconductor structure 20. In addition or in the alternative, the first metal-based layer 26 may be formed with a metal or metal-based layer that has a work function that is suitable for a PMOS transistor, such as be depositing a metal-based layer (e.g., TaC, HfC, TaSi, ZrC, Hf, etc.) or conductive metal oxide to a predetermined thickness adjusting its work function to be close to the valence band of the silicon substrate. As will be appreciated, the first metal or metal-based layer 26 may be formed from one or more layers.

After depositing the metal gate layer(s) 26, a silicon-containing semiconductor layer 28 may be formed using CVD, PECVD, PVD, ALD, or any combination(s) thereof to a thickness in the range of approximately 1-200 nanometers, though other materials (e.g., tungsten or another suitable electrically conductive material) and thicknesses may be used. As deposited, the silicon-containing layer 28 may be formed as an undoped or lightly doped layer having relatively low conductivity or current flow, in which case the conductivity in the silicon-containing layer is established with one or more subsequent doping or implantation steps. However, it will be appreciated, that the silicon-containing layer 28 may be formed as a heavily doped layer having relatively high conductivity, in which case the conductivity in the silicon-containing layer may be reduced in a predetermined region of the silicon-containing layer by counter-doping with one or more subsequent doping or implantation steps. As deposited, the silicon-containing layer 28 can be in an amorphous or polycrystalline state, but it will be in a polycrystalline state after subsequent annealing steps in the device integration. The material(s) for the layer 28 can be silicon, silicon-germanium, or other suitable semiconductors.

Figure 3:
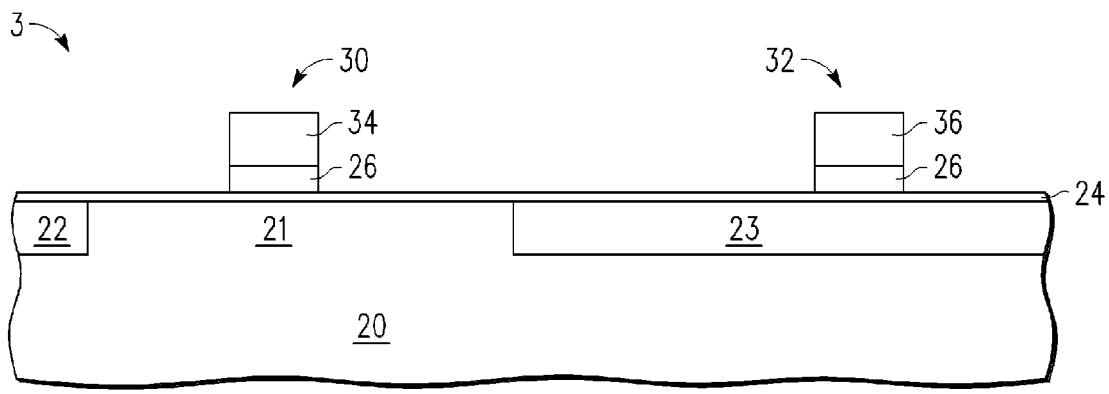
FIG. 3 illustrates processing subsequent to FIG. 2 after the semiconductor layer and underlying metal layer are selectively etched to form gate electrode and resistor structures.

Once the unetched gate stack is formed, a conduction barrier may be formed in the lower portion of the semiconductor layer 28 in the resistor area by doping or implanting the upper portion of the unetched resistor semiconductor layer 28 to create a doping profile that has a relatively heavier doping concentration near an upper surface region, and a significantly reduced doping concentration below the upper surface region. As will be appreciated, the doping profile in the resistor area 97 may be created by selectively masking and implanting the unetched gate stack prior to any selective pattern and etch process is applied to from an etched gate stack and resistor structure. However, the conduction barrier may also be formed after the gate stack is selectively patterned and etched. For example, FIG. 3 illustrates processing of the semiconductor structure 3 subsequent to FIG. 2 after the semiconductor layer 28 and underlying metal layer 26 are selectively etched to form gate electrode structure 30 (including the etched gate semiconductor layer 34) and resistor structure 32 (including the etched semiconductor resistor layer 36). As will be appreciated, the gate electrode and resistor structures 30, 32 may be formed using any desired pattern and etching processes, including application and patterning of photoresist directly on the semiconductor layer 28, or using a multi-layer masking technique to sequentially forming a first anti-reflective coating (ARC) layer, a second masking layer (such as a hardmask or TEOS layer) and a photoresist layer (not shown) which is patterned and trimmed to form the resist pattern 36. The first ARC layer formed over the semiconductor layer 28 will act as a hard mask when the semiconductor layer 28 is subsequently etched. In turn, the second masking layer will serve as a hard mask for the etching of the first ARC layer, and the photoresist layer may be formed from any appropriate photoresist material (e.g., 193 nm resist) that is patterned (e.g., using a 193 nm develop) and etched to form a resist pattern over the second masking layer.

Figure 4:
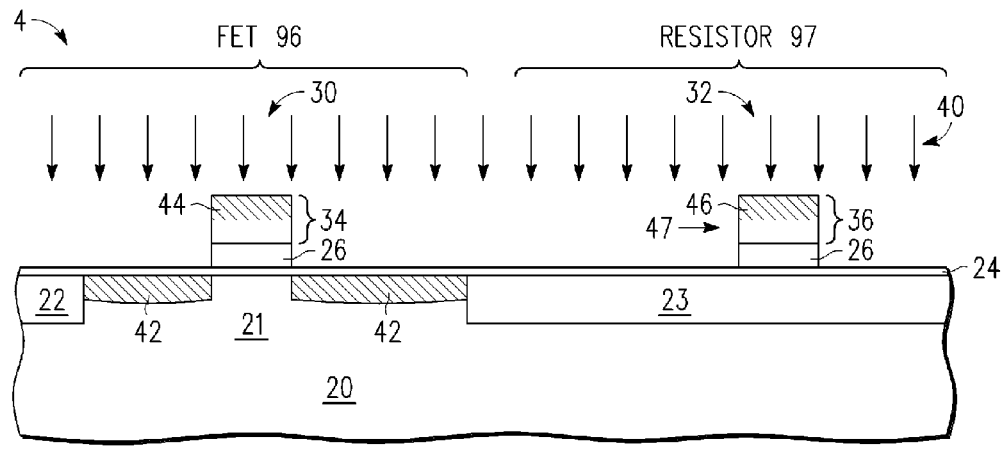
FIG. 4 illustrates processing subsequent to FIG. 3 in accordance with selected embodiments in which a conduction barrier is formed in the lower portion of the resistor semiconductor layer by performing an extension implant of the transistor area which also implants the upper portion of the resistor semiconductor layer.

FIG. 4 illustrates processing of the semiconductor structure 4 subsequent to FIG. 3 in accordance with selected embodiments in which a conduction barrier 47 is formed in the lower portion of the resistor poly layer 36. As illustrated, the conduction barrier 47 may be formed by implanting the upper portion 46 of the poly resistor layer 36 using the implantation process 40 that is applied to form the lightly doped extension regions 42 in the transistor area 96. In an example implementation, the implant process 40 implants n-type impurities into an upper portion 44 of the gate electrode structure 30 and an upper portion 46 of the poly resistor layer 36 to provide a relatively high doping (e.g., over $10^{20}$ $cm^{-3}$) concentration, as compared to the doping concentration of the lower portion (e.g., less than $10^{18}$ $cm^{-3}$). Of course, other impurity types (e.g., B) and implant conditions can be used to achieve the desired doping profile, provided that the relative doping levels are achieved. By using the extension implant 40 to create a conduction region in the top part of the resistor poly layer 36, the doping profile of the resistor poly layer may be controlled to create a strong conduction barrier 47 in the lower portion of the resistor poly layer 36, thereby avoiding the detrimental effect of having a conductive metal layer that is immediately adjacent to the poly resistor layer. In addition or in the alternative, the conduction barrier 47 may be formed using other doping techniques, such as in situ diffusion of impurities into the surface of the resistor poly layer 46, though it may be necessary to mask off other devices, such as FET devices, during diffusion so that the conduction barrier layer is formed only where desired (e.g., in the resistor layers).

Figure 5:
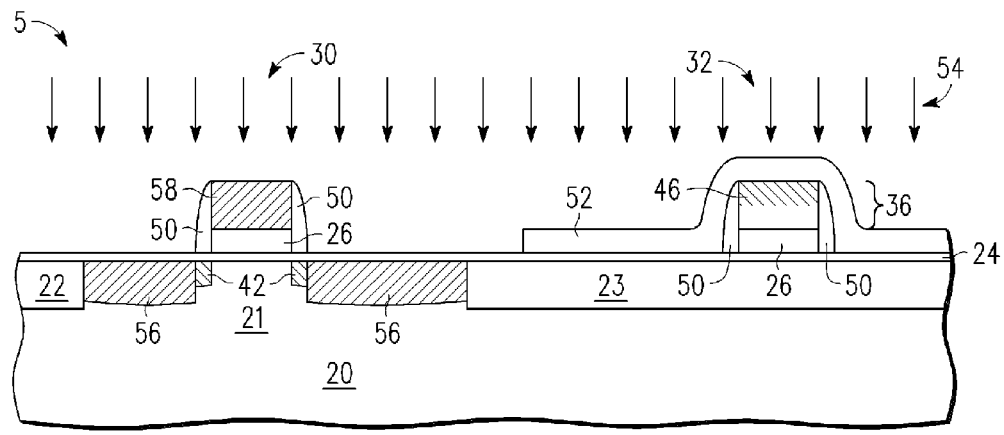
FIG. 5 illustrates processing subsequent to FIG. 4 where an implant mask is formed over the resistor area prior to performing the source/drain implant of the transistor area.

Once the desired doping profile is established in the resistor poly layer 36 of the resistor structure 32, it should be protected against any subsequent doping or implantation processes. For example, FIG. 5 illustrates processing of the semiconductor structure 5 subsequent to FIG. 4 to show how the resistor structure 32 is protected during the heavy source/drain implant. As depicted, one or more sidewall spacers 50 are formed on at least the sidewalls of the gate electrode structure 30 (if not also the resistor structure 32) by depositing and anisotropically etching one or more spacer layers. With the sidewall spacers 50 in place, an implant mask 52 may be formed over the resistor area 97 to expose the transistor area 96. As impurities are implanted 54 into the exposed substrate layer 20 and gate electrode structure 30 to form the deep source/drain regions 56 and conductive region 58 in the exposed gate electrode 30, the implant mask 52 protects the resistor structure 32, thereby preserving the conduction region 46 formed in the resistor poly layer 36. To protect the resistor structure 32, the properties of the implant mask 52 (e.g., materials, thickness, implant resistance, etc.) should be selected to substantially or completely block the heavy source/drain implant 54 from reaching the resistor poly layer 36, or should at least be selected to preserve the relatively light doping in the lower region of the resistor semiconductor layer 36.

Figure 6:
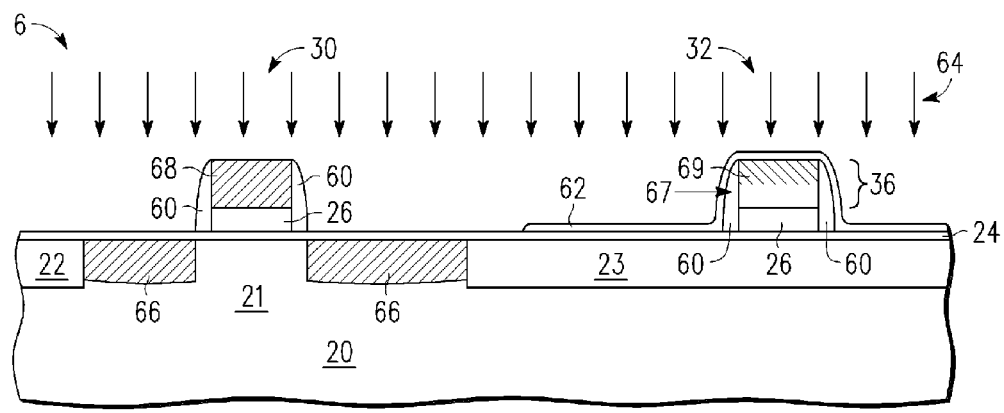
FIG. 6 illustrates processing subsequent to FIG. 3 in accordance with other selected embodiments in which a conduction barrier is formed in the lower portion of the resistor semiconductor layer by forming implantation barrier over the resistor area and then performing a source/drain implant of the transistor area which also implants the upper portion of the resistor semiconductor layer through the implantation barrier.

The doping profile in the resistor semiconductor layer may also be created using other implantation processes from the baseline fabrication sequence. For example, while the implant energy and/or concentration of the deep source/drain implantation process may not be suitable to create the desired doping profile in the resistor poly layer, this can be addressed by forming an implantation barrier over the resistor structure which reduces, but does not completely block, the implant from penetrating into the resistor semiconductor layer. To illustrate an example embodiment, reference is now made to FIG. 6 which illustrates processing of a semiconductor structure 6 subsequent to FIG. 3. As depicted, once one or more sidewall spacers 60 are formed, an implantation barrier layer 62 is selectively formed over the resistor area 97, such as by depositing a layer silicon nitride to a predetermined thickness (e.g., approximately 150-250 Angstroms) and patterning the silicon nitride layer to expose the transistor area 96. With the implantation barrier 62 in place, the impurities that are implanted 64 to form the deep source/drain regions 66 and gate electrode structure 30 are partially, but not completely, blocked by the implantation barrier 62 from reaching the resistor semiconductor layer 36, thereby creating a conductive region 68 in the exposed gate electrode 30 and a conductive region 69 in the upper part of the resistor poly layer 36 to provide the desired or target resistance (e.g., approximately 500-600 ohms/sq), while being separated from the underlying metal layer 26 by a conduction barrier 67. To achieve the desired doping profile in the resistor structure 32, the properties of the implantation barrier 62 (e.g., materials, thickness, implant resistance, etc.) should be selected to only partially block the heavy source/drain implant 64 from reaching the resistor poly layer 36, and/or should be selected to preserve the relatively light doping in the lower region of the resistor semiconductor layer 36. In an example implementation, the implant process 64 implants n-type impurities (e.g., As or P) into an upper portion 69 of the poly resistor layer 36 to provide a relatively high doping (e.g., over $10^{20}$ cm$^{-3}$) concentration, as compared to the doping concentration of the lower portion (e.g., less than $10^{18}$ cm$^{-3}$). Of course, other impurity types (e.g., B) and implant conditions can be used to achieve the desired doping profile, provided that the relative doping levels are achieved. By using the implantation barrier 62 to mitigate or reduce the effect of the source/drain implant 64 in the resistor structure 32 and create a conduction region in the top part of the resistor poly layer 36, the doping profile of the resistor poly layer may be controlled to create a strong conduction barrier 67 in the lower portion of the resistor poly layer 36, thereby avoiding the detrimental effect of having a conductive metal layer that is immediately adjacent to the poly resistor layer. Again, once the desired doping profile is established in the resistor poly layer 36 of the resistor structure 32, it should be protected against any subsequent doping or implantation processes.

Figure 7:
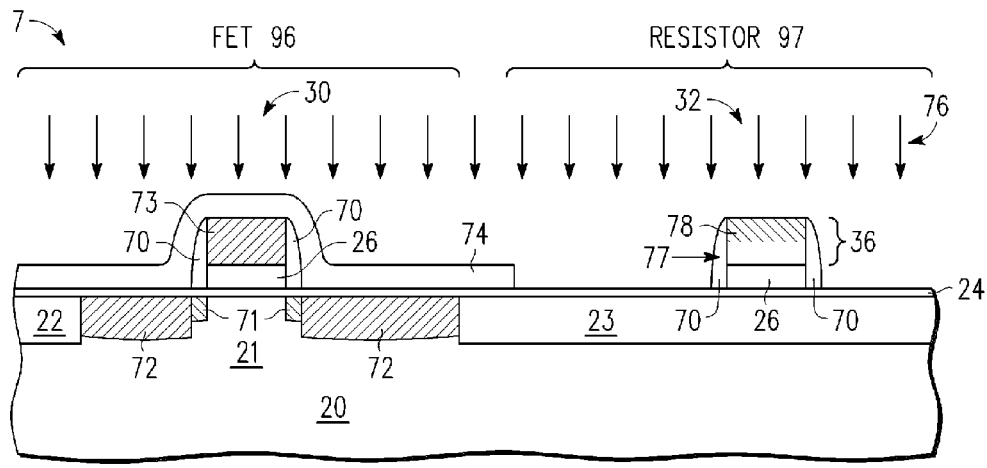
FIG. 7 illustrates processing subsequent to FIG. 3 in accordance with alternate embodiments where an implant mask is formed over the transistor area and a resistor semiconductor implant is performed to implant the upper portion of the resistor semiconductor layer, thereby forming a conduction barrier in the lower portion of the resistor semiconductor layer.

If desired, the doping profile in the resistor semiconductor layer may be created using implantation processes that are not part of the baseline fabrication sequence. For example, a separate or additional implantation process may be applied to achieve the desired doping profile in the resistor poly layer. To illustrate an example embodiment, reference is now made to FIG. 7 which illustrates processing of a semiconductor structure 7 subsequent to FIG. 3. In the illustrated example, extension regions 71 and deep source/drain regions 72 have already been formed by implanting the transistor area 96 around the sidewall spacers 70. In this case, an implant mask (not shown) would be formed to protect the resistor area 97 during the extension and deep source/drain implants. Assuming that the extension and source/drain regions 71, 72 and the conductive region 73 of the gate electrode 30 have already been implanted, an implant mask 74 would be formed to protect the transistor area 96 and expose the resistor area 97. As will be appreciated, the implant mask 74 may be formed by depositing and patterning a layer of photoresist and/or other hardmask layer(s) to a sufficient thickness to block the implantation of impurities 76 into the gate poly 34 and active area 21. With the implant mask 74 in place, a relatively light implantation process 76 may be applied to form a conduction barrier 77 by implanting the upper portion 78 of the poly resistor layer 36. In an example implementation, the implant process 76 implants n-type impurities (e.g., As or P) into an upper portion 78 of the poly resistor layer 36 to provide a relatively high doping (e.g., over $10^{20}$ cm$^{-3}$) concentration, as compared to the doping concentration of the lower portion (e.g., less than $10^{18}$ cm$^{-3}$). Of course, other impurity types (e.g., B) and implant conditions can be used to achieve the desired doping profile, provided that the relative doping levels are achieved. By using the extension implant 76 to create a conduction region in the top part of the resistor poly layer 36, the doping profile of the resistor poly layer may be controlled to create a strong conduction barrier 77 in the lower portion of the resistor poly layer 36, thereby avoiding the detrimental effect of having a conductive metal layer that is immediately adjacent to the poly resistor layer. To confine the diffusion of dopants in the highly-doped top resistor semiconductor layer, diffusion-retarding impurities, such as N, may be introduced to the resistor structure by way of implantation.

Figure 8:
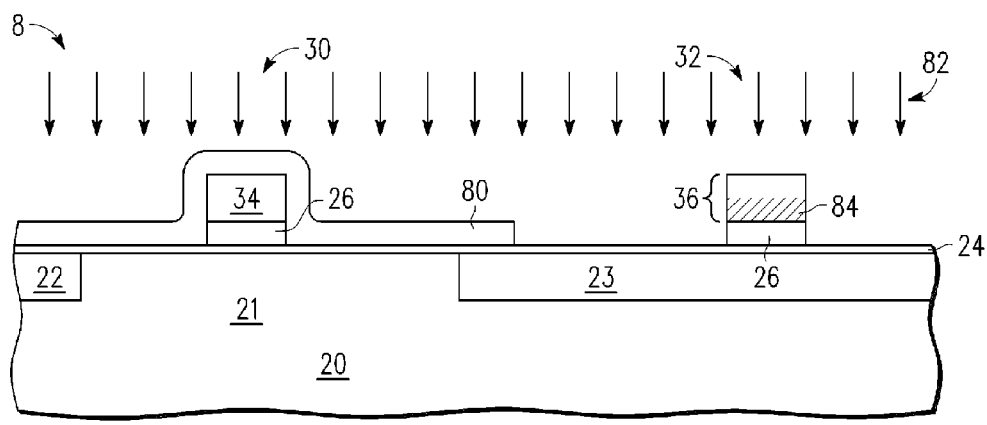
FIG. 8 illustrates processing subsequent to FIG. 3 in accordance with other selected embodiments where an implant mask is formed over the transistor area prior to performing a first implant of a first conductivity type into the resistor semiconductor layer.
Figure 9:
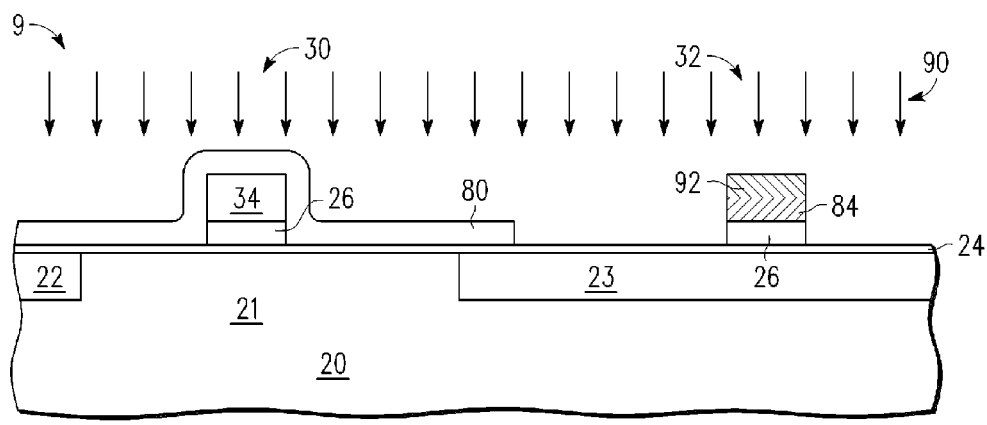
FIG. 9 illustrates processing subsequent to FIG. 8 after the resistor semiconductor layer is implanted with a second implant of a second conductivity type, thereby forming a conduction barrier in the lower portion of the resistor semiconductor layer.

It will be appreciated that a variety of different doping profiles can be produced to prevent conduction through the metal layer of the resistor structure 32. For example, the higher conductivity regions in the resistor poly layer need only be separated from underlying metal layer by a region of lower conductivity, whether located adjacent to the metal layer or not. In other embodiments, the metal conduction may also be disabled by creating other doping profiles that effectively confine the conduction to the top portion of the resistor poly layer. For example, a p/n diode junction may be formed in the resistor semiconductor layer using two or more separate processes. To illustrate an example embodiment, reference is now made to FIG. 8 which illustrates processing of a semiconductor structure 8 subsequent to FIG. 3. In the illustrated example, the extension regions \and deep source/drain regions in the transistor area 96 are not shown, and they may be formed separately beforehand or subsequently. In either case, an implant mask 80 is formed to protect the transistor area 96 and expose the resistor area 97. As will be appreciated, the implant mask 80 may be formed by depositing and patterning a layer of photoresist and/or other hardmask layer(s) to a sufficient thickness to block the implantation of impurities 82 into the gate poly 34 and active area 21. With the implant mask 80 in place, a first implantation process 82 is applied to form a first conductivity type region 84 in a predetermined region of the resistor semiconductor layer 84. In an example implementation, the implant process 82 implants n-type impurities (e.g., As or P) into a lower portion 84 of the poly resistor layer 36 to provide a relatively high doping (e.g., over $10^{20}$ cm$^{-3}$) concentration. Keeping the implant mask 80 in place, a second implantation process 90 is applied to form a second, opposite conductivity type region 92 in a predetermined region of the resistor semiconductor layer 84. In an example implementation, the implant process 90 implants p-type impurities (e.g., B) into an upper portion 892 of the poly resistor layer 36 to provide a relatively high doping (e.g., over $10^{20}$ cm$^{-3}$) concentration. By creating a lower region of a first conductivity type and an upper region of a second, opposite conductivity type, a p-n junction is created in the resistor poly layer 36 which provides a strong conduction barrier at the p-n junction by blocking current flow to the metal layer, thereby confining the conduction to the upper region and avoiding the metal conductance problem.

Figure 10:
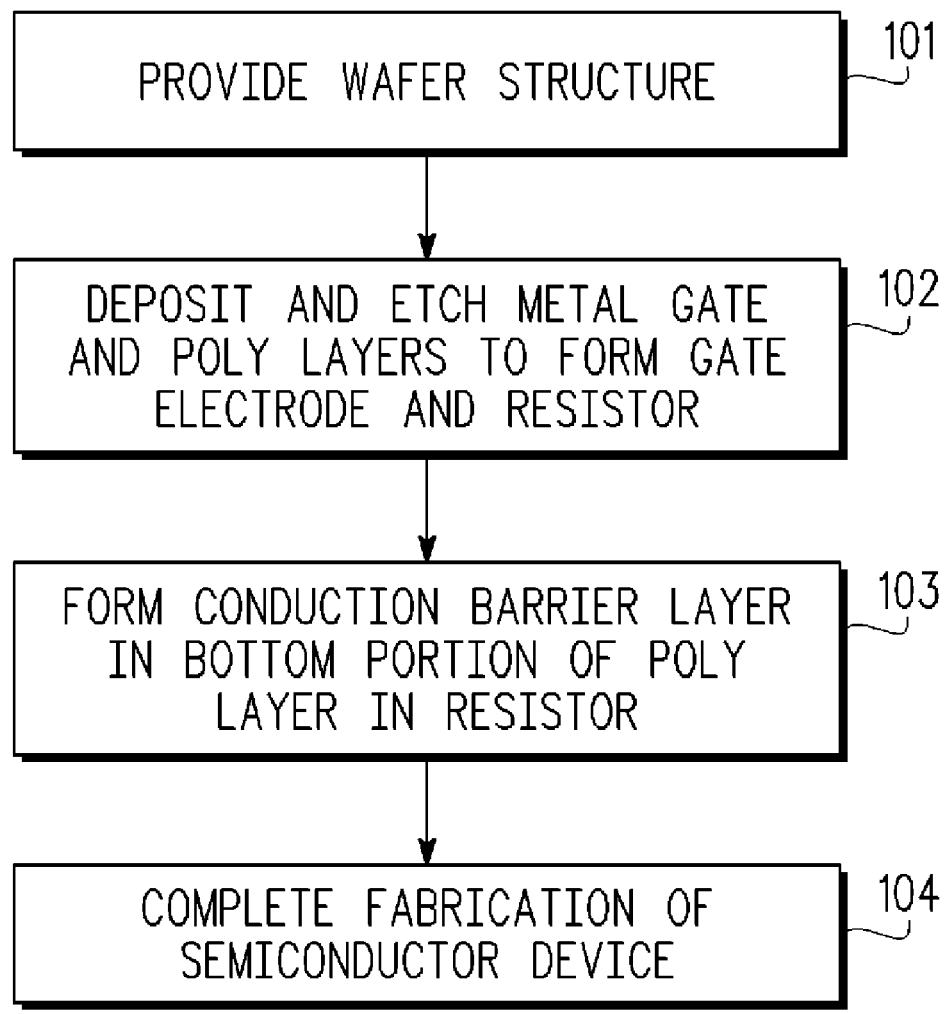
FIG. 10 is a flowchart of one embodiment of fabricating a semiconductor device in accordance with selected embodiments of the present invention.

The fabrication of an integrated semiconductor resistor as part of a metal gate CMOS process by forming a conduction barrier in the semiconductor resistor layer may be understood with reference to the flowchart depicted in FIG. 10. As shown therein, such a method will typically involve providing wafer structure in step 101. On the wafer structure, a metal layer and semiconductor layer are sequentially deposited over the transistor and resistor areas, and may be selectively etched to form a gate electrode structure and a resistor structure at step 102. Subsequently, a conduction barrier is formed in the lower portion of the semiconductor layer in the resistor area by doping or implanting the upper portion of the resistor semiconductor layer as shown in step 103. By controlling the doping of the resistor semiconductor layer, a doping profile may be achieved that has a relatively heavier doping concentration near an upper surface region (which provides a conductive region having a desired or target resistance), and a relatively light doping concentration below the upper surface region (which limits current flow in the lower part of the resistor semiconductor layer), thereby creating a strong conduction barrier in the lower part of the resistor semiconductor layer in contact with the gate metal layer. As shown in step 104, the gate electrode structure and a resistor structure (with its conduction barrier) are then processed to complete the fabrication of the semiconductor device.

Possible applications for integrating the semiconductor resistor as part of a metal gate stack disclosed herein include forming metal gate transistor devices and associated resistor circuits. In such applications, it will be appreciated that additional processing steps will be used to complete the fabrication of the metal gate electrodes into functional transistor devices. As examples, one or more sacrificial oxide formation, stripping, isolation region formation, extension implant, halo implant, spacer formation, source/drain implant, silicide formation, heat drive or anneal steps, and/or polishing steps may be performed, along with conventional backend processing (not depicted), typically including formation of multiple levels of interconnect that are used to connect the transistors in a desired manner to achieve the desired functionality. In addition, other semiconductor device levels may be formed underneath or above the disclosed semiconductor structures. Thus, the specific sequence of steps used to complete the fabrication of the transistor devices may vary, depending on the process and/or design requirements. While the illustrative embodiments are described with reference to forming a metal gate electrode of a MOSFET transistor device, it will be appreciated that various embodiments of the present invention can be used for any future CMOS technology that utilizes metal gates and high-k dielectrics, including but not limited to forming non-volatile memory (NVM) transistor devices (such as a nanocluster stack-based NVM devices and floating gates transistor devices), Fin Field Effect Transistors (FinFETs), Double gate Fully Depleted Semiconductor-on-Insulator (FDSOI) transistors or other transistor geometries.

By now it should be appreciated that there is provided herein a method for fabricating a semiconductor structure in which a semiconductor resistor is formed from a metal gate electrode stack. As disclosed, a semiconductor substrate having a transistor area and a resistor area is provided, and a gate dielectric layer (e.g., a high-k dielectric layer) is formed over at least the transistor area (in not also the resistor area). Subsequently, a first metal-based layer (e.g., TiC, TiN, TaC, HfC, TaSi, ZrC or Hf) is formed over the transistor area and the resistor area, and then a semiconductor layer is deposited over the first metal-based layer. After patterning and etching the semiconductor layer and the first metal-based layer, a metal gate electrode structure is formed that includes a gate poly layer over the transistor area, and a resistor structure is formed that includes a resistor poly layer over the resistor area. By implanting impurities of a first conductivity type into the resistor poly layer, a conduction barrier is formed in a lower portion of the resistor poly layer. In selected embodiments, the impurities are implanted by simultaneously implanting the gate poly layer and the resistor poly layer with an extension implant that is used to form extension regions adjacent to the metal gate electrode structure so that an upper portion of the resistor poly layer has a relatively high doping concentration and the lower portion of the resistor poly layer has a relatively light doping concentration. In other embodiments, the impurities are implanted by forming an implantation barrier (e.g., a silicon nitride layer that is deposited to a thickness of approximately 150-250 Angstroms) that covers the resistor poly layer and exposes the transistor area, and after forming implant spacers on the metal gate electrode structure, the gate poly layer and the resistor poly layer are simultaneously implanted with a source/drain implant that is used to form source/drain regions adjacent to the metal gate electrode structure so that an upper portion of the resistor poly layer has a relatively high doping concentration and the lower portion of the resistor poly layer has a relatively light doping concentration, where the source/drain implant implants the upper portion of the resistor semiconductor layer through the implantation barrier. In other embodiments, the impurities are implanted by implanting first conductivity type impurities (e.g., p-type) into an upper portion of the resistor poly layer to form a first region having a relatively high doping concentration of the first conductivity type impurities, and implanting a second, opposite conductivity type impurities (e.g., n-type) into a lower portion of the resistor poly layer to form a second region having a relatively high doping concentration of the second conductivity type impurities, where a junction between the first and second regions forms the conduction barrier in the resistor poly layer. Alternatively, the impurities may be implanted by forming an implant mask over the transistor area to protect the metal gate electrode structure, and then implanting first conductivity type impurities into an upper portion of the resistor poly so that the upper portion of the resistor poly layer has a relatively high doping concentration and the lower portion of the resistor poly layer has a relatively light doping concentration. And the impurities may be implanted into an upper portion of the resistor poly layer to form a conduction barrier in a lower portion of the resistor poly layer, they may also be implanted to counter-dope the lower portion of the resistor poly layer to form a conduction barrier in the lower portion of the resistor poly layer.

In another form, there is provided a method for simultaneously forming a metal gate and a semiconductor resistor. In the disclosed methodology, a semiconductor substrate is provided that includes one or more active surface regions and surface regions of electrical isolation. After forming a layer of oxide on the surface of the semiconductor substrate, a metallic layer (e.g., a thin layer of TiC, TiN, TaC, HfC, TaSi, ZrC or Hf) is formed or deposited over the oxide layer, and then a semiconductor layer (a layer of silicon or silicon-germanium in an amorphous or polycrystalline state) is formed or deposited over the metallic layer. A pattern and etch process is applied to the semiconductor layer and the metallic layer to form a metal-semiconductor gate structure over the active surface region and a metal-semiconductor resistor structure over the surface region of electrical isolation. Thereafter, impurity ions are selectively implanted into a lower portion of the semiconductor layer in the metal-semiconductor resistor structure to form a conduction barrier. The selective ion implantation may be performed by simultaneously implanting the semiconductor layer in the metal-semiconductor gate structure and the metal-semiconductor resistor structure with an extension implant that is used to form extension regions adjacent to the metal-semiconductor gate structure so that an upper portion of the semiconductor layer in the metal-semiconductor resistor structure has a relatively high doping concentration and the lower portion of the resistor semiconductor layer has a significantly lower doping concentration. Alternatively, the selective ion implantation may be performed by selectively forming an implantation barrier over the metal-semiconductor resistor structure which provides a partial implantation block during a subsequent implantation, and then simultaneously implanting the metal-semiconductor gate structure and the metal-semiconductor resistor structure so that an upper portion of the semiconductor layer in the metal-semiconductor resistor structure has a relatively high doping concentration and the lower portion of the semiconductor layer in the metal-semiconductor resistor structure has a relatively light doping concentration. In yet another embodiment, the selective ion implantation may be performed by implanting first conductivity type impurities into an upper portion of the semiconductor layer in the metal-semiconductor resistor structure to form a first region having a relatively high doping concentration of the first conductivity type impurities, and implanting second, opposite conductivity type impurities into a lower portion of the semiconductor layer in the metal-semiconductor resistor structure to form a second region having a relatively high doping concentration of the second conductivity type impurities, where a P-N diode junction between the first and second regions forms the conduction barrier in the metal-semiconductor resistor structure. In still yet another embodiment, the selective ion implantation may be performed by forming an implant mask over the active surface region to protect the metal-semiconductor gate structure, and implanting first conductivity type impurities into an upper portion of the semiconductor layer of the metal-semiconductor resistor structure so that the upper portion has a relatively high doping concentration and a lower portion of the semiconductor layer in the metal-semiconductor resistor structure has a relatively light doping concentration.

In yet another form, there is provided an integrated circuit and methodology for fabricating same. As formed, the integrated circuit includes a metal-containing device structure, such as a metal gate electrode structure, formed over an active area of a semiconductor substrate, where the metal-containing device structure includes a first semiconductor layer formed over a first metal-based layer. The integrated circuit also includes a resistor structure formed over an isolation layer on the semiconductor substrate, where the resistor structure includes a second semiconductor layer formed over a second metal-based layer. As formed, the second semiconductor layer includes a conduction barrier in contact with the first metal-based layer and having an impurity doping profile which limits conduction to an upper portion of the second semiconductor layer. For example, the conduction barrier may be formed to include impurities of a first conductivity type implanted in a lower portion of the second semiconductor layer and impurities of a second conductivity type implanted in an upper portion of the second semiconductor layer.

Although the described exemplary embodiments disclosed herein are directed to various semiconductor device structures and methods for making same, the present invention is not necessarily limited to the example embodiments which illustrate inventive aspects of the present invention that are applicable to a wide variety of semiconductor processes and/or devices. Thus, the particular embodiments disclosed above are illustrative only and should not be taken as limitations upon the present invention, as the invention may be modified and practiced in different but equivalent manners apparent to those skilled in the art having the benefit of the teachings herein. For example, the selective implantation of the resistor semiconductor layer can be done after the metal gate stack is etched to form the gate electrode and resistor structures (as shown in the figures) or prior to etching of the metal gate stack. Also, the selective implantation of the resistor semiconductor layer may be used to indirectly form a conduction barrier by creating conductive regions in an otherwise low-conductivity resistor semiconductor layer (as described above), or to counter-dope a previously doped and conductive resistor semiconductor layer, thereby directly forming a conduction barrier. In addition, the various silicon-based constituent layers may be formed with different conductive materials than those disclosed. Moreover, the thickness of the described layers may deviate from the disclosed thickness values, and any specified etch chemistries are provided for illustration purposes only. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a resistor from a metal gate electrode stack, comprising:
   providing a semiconductor substrate comprising a transistor area and a resistor area;

forming a gate dielectric layer over at least the transistor area;

forming a first metal-based layer over the transistor area and the resistor area;

depositing a semiconductor layer over the first metal-based layer;

patterning and etching the semiconductor layer and the first metal-based layer to form a metal gate electrode structure comprising a gate semiconductor layer over the transistor area and a resistor structure comprising a resistor semiconductor layer over the resistor area; and forming a conduction barrier in a lower portion of the resistor semiconductor layer.

2. The method for forming a resistor from a metal gate electrode stack according to claim 1 wherein forming a gate dielectric layer comprises forming a high-k dielectric layer over at least the transistor area.

3. The method for forming a resistor from a metal gate electrode stack according to claim 1 wherein forming a first metal-based layer comprises depositing a thin layer of TiC, TiN, TaC, HfC, TaSi, ZrC or Hf.

4. The method for forming a resistor from a metal gate electrode stack according to claim 1, where depositing a semiconductor layer comprises depositing a layer of silicon or silicon-germanium in an amorphous or polycrystalline state.

5. The method for forming a resistor from a metal gate electrode stack according to claim 1, where forming the conduction barrier comprises implanting the resistor semiconductor layer with an extension implant that is used to form extension regions adjacent to the metal gate electrode structure so that an upper portion of the resistor semiconductor layer has a relatively high doping concentration and the lower portion of the resistor semiconductor layer has a relatively light doping concentration.

6. The method for forming a resistor from a metal gate electrode stack according to claim 1, where forming the conduction barrier comprises:

in any order, forming an implantation barrier that covers the resistor semiconductor layer and exposes the transistor area, and forming implant spacers on sidewalls of at least the metal gate electrode structure; and then implanting the resistor semiconductor layer with a source/drain implant that is used to form source/drain regions adjacent to the metal gate electrode structure so that an upper portion of the resistor semiconductor layer has a relatively high doping concentration and the lower portion of the resistor semiconductor layer has a relatively light doping concentration, where the source/drain implant implants the upper portion of the resistor semiconductor layer through the implantation barrier.

7. The method for forming a resistor from a metal gate electrode stack according to claim 6, where forming an implantation barrier comprises depositing a silicon nitride layer over at least the resistor semiconductor layer to a thickness of approximately 150-250 Angstroms prior to implanting the resistor semiconductor layer with a source/drain implant.

8. The method for forming a resistor from a metal gate electrode stack according to claim 1, where forming the conduction barrier comprises, in any order:

implanting first conductivity type impurities into an upper portion of the resistor semiconductor layer to form a first region having a relatively high doping concentration of the first conductivity type impurities; and implanting second, opposite conductivity type impurities into a lower portion of the resistor semiconductor layer to form a second region having a relatively high doping concentration of the second conductivity type impurities, where a P-N diode junction between the first and second regions forms the conduction barrier in the resistor semiconductor layer.

9. The method for forming a resistor from a metal gate electrode stack according to claim 1, where forming the conduction barrier comprises, in any order:

forming an implant mask over the transistor area to protect the metal gate electrode structure; and implanting first conductivity type impurities into an upper portion of the resistor semiconductor so that the upper portion of the resistor semiconductor layer has a relatively high doping concentration and the lower portion of the resistor semiconductor layer has a relatively light doping concentration.

10. The method for forming a resistor from a metal gate electrode stack according to claim 1, where forming the conduction barrier comprises implanting impurities of a first conductivity type into an upper portion of the resistor semiconductor layer to form a conduction barrier in a lower portion of the resistor semiconductor layer.

11. The method for forming a resistor from a metal gate electrode stack according to claim 1, where forming the conduction barrier comprises implanting impurities of a first conductivity type to counter-dope the lower portion of the resistor semiconductor layer to form a conduction barrier in the lower portion of the resistor semiconductor layer.

12. A method for simultaneously forming a metal gate and a semiconductor resistor, comprising:

providing a semiconductor substrate comprising at least one active surface region and a surface region of electrical isolation;

forming a dielectric layer on a surface of the semiconductor substrate;

forming a metallic layer over the dielectric layer;

forming a semiconductor layer over the metallic layer;

patterning and etching the semiconductor layer and the metallic layer to form a metal-semiconductor gate structure over the active surface region and a metal-semiconductor resistor structure over the surface region of electrical isolation; and forming a conduction barrier in a lower portion of the semiconductor layer in the metal-semiconductor resistor structure.

13. The method for simultaneously forming a metal gate and a semiconductor resistor according to claim 12, where forming a metallic layer over the dielectric layer comprises depositing a thin layer of TiC, TiN, TaC, HfC, TaSi, ZrC or Hf.

14. The method for simultaneously forming a metal gate and a semiconductor resistor according to claim 12, where forming a semiconductor layer comprises depositing a layer of silicon or silicon-germanium in an amorphous or polycrystalline state.

15. The method for simultaneously forming a metal gate and a semiconductor resistor according to claim 12, where forming the conduction barrier comprises implanting the metal-semiconductor resistor structure with an extension implant that is used to form extension regions adjacent to the metal-semiconductor gate structure so that an upper portion of the semiconductor layer in the metal-semiconductor resistor structure has a relatively high doping concentration and the lower portion of the resistor semiconductor layer has a significantly lower doping concentration.

16. The method for simultaneously forming a metal gate and a semiconductor resistor according to claim 12, where forming the conduction barrier comprises:

selectively forming an implantation barrier over the metal-semiconductor resistor structure which provides a partial implantation block during a subsequent implantation; and then implanting the metal-semiconductor resistor structure with an implant that is used to form source/drain regions adjacent to the metal-semiconductor gate structure so that an upper portion of the semiconductor layer in the metal-semiconductor resistor structure has a relatively high doping concentration and the lower portion of the semiconductor layer in the metal-semiconductor resistor structure has a relatively light doping concentration.

17. The method for simultaneously forming a metal gate and a semiconductor resistor according to claim 12, where forming the conduction barrier comprises, in any order:

implanting first conductivity type impurities into an upper portion of the semiconductor layer in the metal-semiconductor resistor structure to form a first region having a relatively high doping concentration of the first conductivity type impurities; and implanting second, opposite conductivity type impurities into a lower portion of the semiconductor layer in the metal-semiconductor resistor structure to form a second region having a relatively high doping concentration of the second conductivity type impurities, where a P-N diode junction between the first and second regions forms the conduction barrier in the metal-semiconductor resistor structure.

18. The method for simultaneously forming a metal gate and a semiconductor resistor according to claim 12, where forming the conduction barrier comprises, in any order:

forming an implant mask over the active surface region to protect the metal-semiconductor gate structure; and implanting first conductivity type impurities into an upper portion of the semiconductor layer of the metal-semiconductor resistor structure so that the upper portion has a relatively high doping concentration and a lower portion of the semiconductor layer in the metal-semiconductor resistor structure has a relatively light doping concentration.

19. An integrated circuit, comprising:

a semiconductor substrate;

a metal-containing device structure formed over an active area of the semiconductor substrate comprising a first semiconductor layer formed over a first metal-based layer; and a resistor structure formed over an isolation layer on the semiconductor substrate comprising a second semiconductor layer formed over a second metal-based layer, where the second semiconductor layer comprises a conduction barrier implemented with a difference in doping profile between an upper portion of the second semiconductor layer and a lower portion of the second semiconductor layer.

20. The integrated circuit of claim 19, where the conduction barrier comprises impurities of a first conductivity type implanted in a lower portion of the second semiconductor layer and impurities of a second conductivity type implanted in an upper portion of the second semiconductor layer.

* * * * *